United States Patent [19]
Black et al.

[11] Patent Number: 5,998,292
[45] Date of Patent: Dec. 7, 1999

[54] METHOD FOR MAKING THREE DIMENSIONAL CIRCUIT INTEGRATION

[75] Inventors: Charles Thomas Black, White Plains; Joachim Norbert Burghartz, Shrub Oak; Sandip Tiwari, Ossining, all of N.Y.; Jeffrey John Welser, Stamford, Conn.

[73] Assignee: International Business Machines Corporation, Armonk, N.Y.

[21] Appl. No.: 08/968,402

[22] Filed: Nov. 12, 1997

[51] Int. Cl.$^6$ .................................................. H01L 21/4763
[52] U.S. Cl. ........................ 438/618; 438/652; 438/642; 438/666
[58] Field of Search ..................................... 438/597, 618, 438/622, 629, 642, 652, 666

[56] References Cited

PUBLICATIONS

J. Carson, "The Emergence of Stacked 3D Silicon and Its Impact on Microelectronics Systsms Integration," Proceedings of Eighth Annual IEEE International Conference on Innovative Systems in Silicon, p. 1 (1996).

K. Yamazaki, et al., "4–Layer 3–D IC Technologies For Parallel Signal Processing," Tech. Dig. of IEDM, p. 599 (1990).

K. Kioi, et al., "Design and Implementation of a 3D–LSI Character Recognition Image Sensor," Tech. Dig. of IEDM, p. 279 (1990).

T. Kunio, et al., "Three Dimensional ICs, Having Four Stacked Active Device Layers," Tech. Dig. of IEDM, p. 837 (1989).

Primary Examiner—Tuan H. Nguyen
Assistant Examiner—Craig Thompson
Attorney, Agent, or Firm—Scully, Scott, Murphy & Presser; Manny W. Schecter

[57] ABSTRACT

The present invention relates to a method for interconnecting, through high-density micro-post wiring, multiple semiconductor wafers with lengths of about a millimeter or below. Specifically, the method of the present invention comprises etching at least one hole, defined by walls, at least partly through a semiconducting material; forming a layer of electrically insulating material to cover said walls; and forming an electrically conductive material on said walls within the channel of the hole. Microelectronic devices containing the micro-post wiring of the present invention are also disclosed herein.

20 Claims, 6 Drawing Sheets

METHOD FOR MAKING THREE DIMENSIONAL CIRCUIT INTEGRATION

FIELD OF THE INVENTION

The present invention relates to semiconductor circuit integration and, in particular, to a method for interconnecting, through high density micro-post wiring, multiple wafers of silicon with wire lengths of a millimeter or less. The present invention is a cost efficient method that is especially useful in high speed, high density, and low latency interconnection of circuits for providing interconnects between separately processed wafers.

PRIOR ART

In semiconductor manufacturing, reduction in device size is used to increase the density of the devices. Device scaling, however, has its limits and the cost for implementing existing technology is escalating. As device density increases, wiring has become a strong obstacle to performance and function integration. Another limitation arises from the need to interconnect circuits over wide bandwidth buses. Some examples of this include: interconnects between slow and fast memory devices, between memory and processors, and between switches and processors. Additional wiring problems also arise in applications that require interconnection of devices and structures made using widely dissimilar technologies, e.g. individual pixel addressable cameras using photodiodes and CMOS, and wireless applications with large low-loss lumped elements coupled to transistors, applications requiring interconnection of low power (CMOS) with high speed (bipolar) elements. Interconnecting separately processed wafers saves processing time and is likely to be economically efficient.

A major development in this area, particularly three-dimensional integration, was reported by J. Carson, "Emergence of stacked 3D silicon and its impact on microelectronic systems integration," Proc. of Eighth IEEE International Conference on Innovative Systems in Silicon, p.1 (1996). This paper by J. Carson is directed to stacking of fabricated and cut-up chips, such as memory chips, to create a cube. Wafers are typically 650 $\mu$m thick and 16 chips are used to form a cubic structure. Outputs to be interconnected are at the edges of the chip. The chips are interconnected and the outputs are brought out on the planar board on which the chips are mounted. The technique disclosed by J. Carson works at the chip level rather than the wafer level and thus does not reduce path lengths within the chip. Since chips are only interconnected at the outsides of the chips in the aforementioned disclosure, the wiring limitations due to on-chip delays continue to remain a potential problem. Additional work related to three-dimensional integration using laser-recrystallization or seeded-growth silicon-on-insulator technology has been described by K. Yamazaki, et al., "4-Layer 3D IC technologies for parallel signal processing," Tech. Dig. of IDEM, p. 599 (1990); K. Kioi, et al., "Design and Implementation of a 3D-LSI Character Recognition Image Sensor," Tech. Dig. of IEDM, p. 279 (1990); T. Kunio, et al., "Three dimensional ICs, having four stacked active device layers," Tech. Dig. of IEDM, p. 837 (1989); and Y. Inoue, et al., "4 PMOS/2 NMOS vertically stacked CMOS-SRAM with 0.6 $\mu$m design rule," Tech. Dig. of VSLI Technology Symposium, p. 39 (1990).

The disclosure of K. Yamazaki, et al. relates to an image processor fabricated over four silicon-on-insulator (SOI) layers that are grown by seeded overgrowth techniques. This technique requires metallurgy and devices to withstand the process conditions employed for overgrowth. Normally this necessitates device geometries that are relaxed compared to those currently utilized in the silicon industry.

The disclosure of K. Kioi, et al. reports a similar SOI technique of growing single-crystal silicon using laser irradiation for recrystallization in order to place an imaging sensor and transistor circuits on different layers. The paper authored by T. Kunio, et al. also uses laser recrystallization in order to fabricate CMOS devices on multiple layers. Y. Inoune, et al. describes the use of single-crystal and poly-crystal mixed transistors to form circuits over two layers.

In the disclosures of K. Yamazaki, et al., K. Kioi, et al., T. Kunio, et al. and Inoue, et al., short distance interconnects are described. Despite this disclosure, these references employ methods where processing is performed sequentially and requires compromises with the device in order to be compatible with the specific SOI technology.

There is thus a need for developing a new and improved method wherein integration can be achieved between processed wafers. This method would allow for short wiring (less than a mm) and wide buses to be achieved. Such a method would also provide a solution to the problem of wide data bandwidth communication between circuits, of achieving higher levels of integration, and of integration of circuits with differing processing needs while maintaining an increased manufacturing rate.

SUMMARY OF THE INVENTION

One object of the present invention is to provide a method of interconnecting circuits on more than one wafer through high-density, sub-mm length wiring.

Another object of the present invention is to allow for interconnection of active and passive elements fabricated using dissimilar technologies.

A further object of the present invention is to provide a means for forming interconnects that allow for very high electronic speeds. An additional object of the instant invention is to improve the throughput of integrated circuits.

These as well as other objects are achieved in the present invention by utilizing electro- or electroless plated wires (micro-posts) that are formed within etched insulator-walled channels in silicon wafers and interconnecting wafers using these micro-posts. Specifically, the method of the present invention comprises the step of:

(a) etching at least one hole defined by a wall and a channel at least partly through a wafer of a semiconductor material;

(b) forming a layer of electrically insulating material to cover said wall; and (c) forming an electrically conductive material on said covered wall within said channel of the hole.

In one embodiment of the method of the present invention, the holes are etched partly through the wafer and then the opposite surface of the wafer is ground away so as to cause the holes to pass entirely through the wafer.

In another embodiment of the present invention, at least two wafers are stacked with at least one corresponding hole in alignment. When a stacked configuration is desirable, the method of the present invention further comprises the step of heating the stacked wafers to form an electrical connection between the conducting material and the corresponding holes.

In yet another embodiment of the method of the present invention, a matrix of hole channels are first etched into a wafer and then the wafer is diced into individual chip elements of the matrix.

Another aspect of the present invention relates to a microelectronic device which is prepared in accordance with the method of the present invention. Specifically, the microelectronic device of the present invention comprises:

(a) at least one laminar block of a semiconductor material having surfaces on opposite sides thereof, each block having a hole extending therethrough and between said surfaces, said hole being defined by a wall;

(b) a tubular layer composed of an electrically insulating layer covering said wall of said hole and extending between said surfaces; and (c) a column of electrically conductive material disposed within said tubular layer and extending between said surfaces.

The microelectronic device of the present invention may further comprise a microelectronic circuit formed on at least one of said opposite surfaces. The microelectronic circuit is electrically connected to the column of said electronically conductive material.

DETAILED DESCRIPTION OF THE INVENTION

Figure 1A:
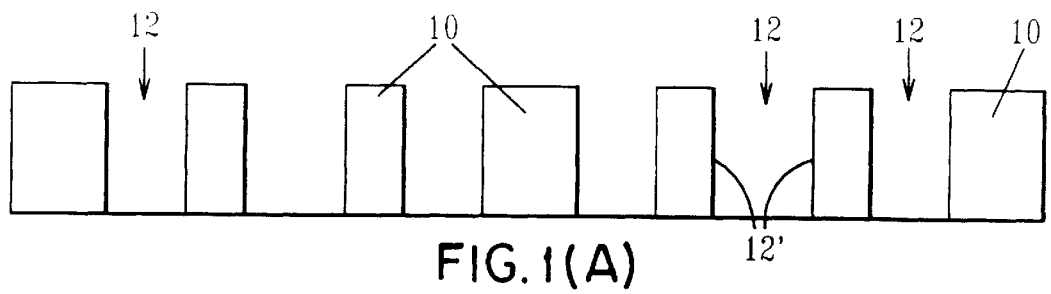
FIGS. 1(A)–1(E) are cross sectional views showing one embodiment of the method of the present invention wherein holes are etched entirely through a silicon wafer.

The present invention which provides a method for fabricating multiple wiring interconnects will now be described in greater detail with reference to the accompanying drawings wherein like reference numerals are used for like and corresponding elements of the drawings. The interconnects produced in accordance with the present method, which are referred to herein as micro-posts, are highly dense, short, capable of high speed, low resistance, low capacitance, and comparable in properties to mid-back-end of line wiring.

Figure 1B:
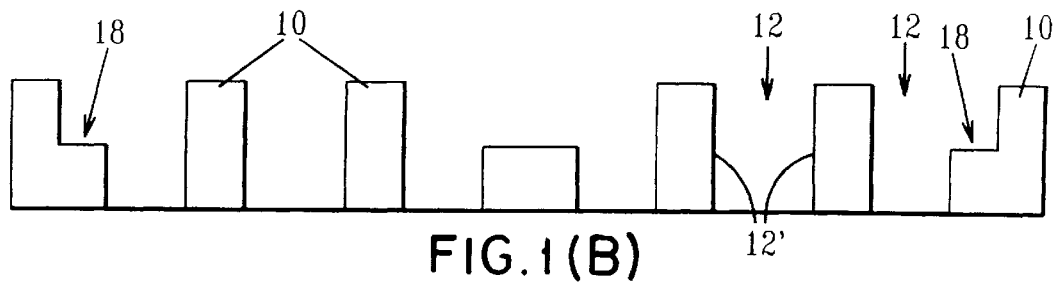
Figure 1C:
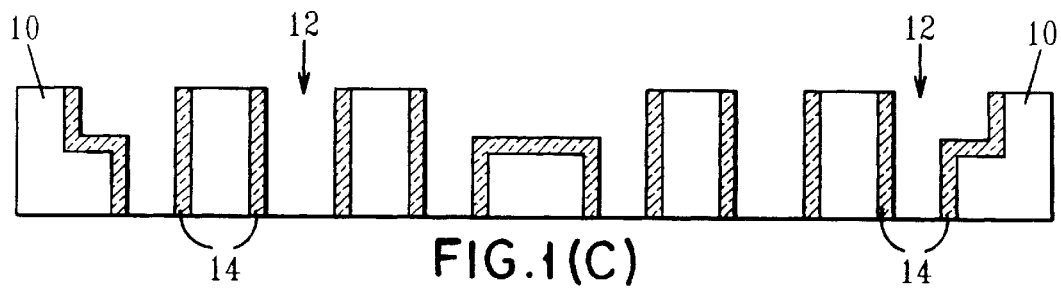
Figure 1D:
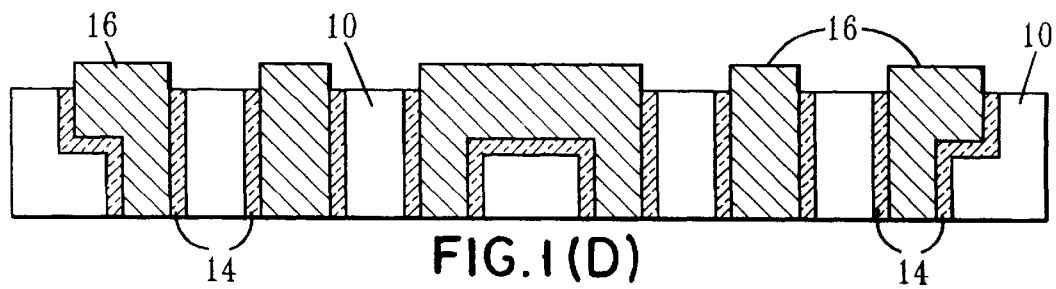
Figure 1E:
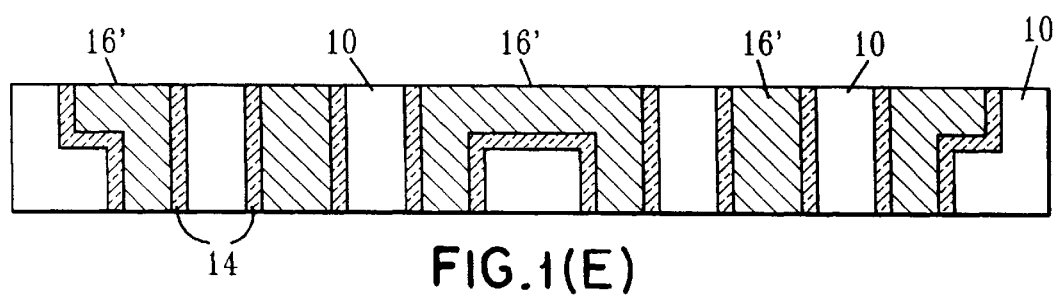
Figure 2A:
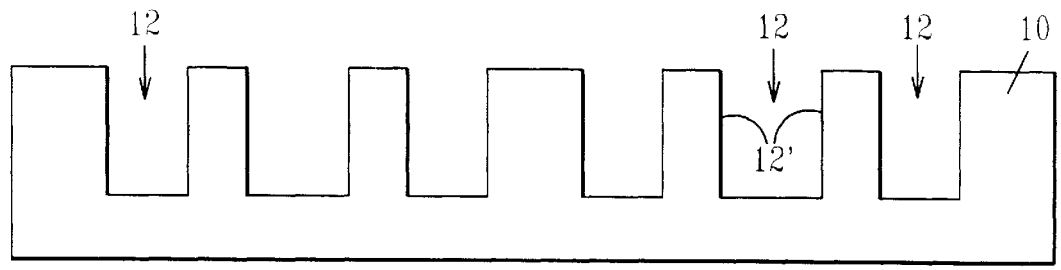
FIGS. 2(A)–2(E) are cross sectional views shopping another embodiment of method of the present invention wherein holes are etched partly through a silicon wafer.

Reference is made first to FIGS. 1(A)–(E) and 2(A)–(E) which show two embodiments of the method of the present invention. In the first embodiment of the method of the present invention, holes 12 are etched entirely through a semiconductor wafer 10. This embodiment of the present invention is shown in FIG. 1(A). In the second embodiment of the present invention, as is shown in FIG. 2(A), holes 12 are etched partly through semiconductor wafer 10. In both sets of figures, i.e. FIGS. 1(A) and 2(A), the holes can be further defined as having walls 12' within the channel of the holes.

No matter which of these embodiments are employed, the following provides a description of how holes 12 are etched into the semiconductor wafer 10. First, a mask, which is not shown in the drawings of the present invention for simplicity, is patterned on the back side of semiconductor wafer 10 in which a micro-post is to be created. The mask is made of material that etches slower than the semiconductor wafer. Any of the conventional known dielectric or metal masks can be employed in the present invention. Examples of suitable dielectric masks that can be employed in the present invention include: diamond-like carbon, silicon oxide, silicon nitride and the like. Metal masks that can be employed in the present invention include: titanium, titanium nitride, chromium, nickel and the like.

Semiconductor wafer 10 comprises a conventional semiconducting material such as Si, Ge, GaAs, GaP, InAs, InP and the like. A highly preferred semiconducting material employed in the present invention is one that comprises Si.

After providing the desired pattern to the back side of the semiconductor wafer, holes 12 are etched into semiconductor wafer 10. Etching may be carried out using either a dry or wet etch. The type of etchant used in either technique is one which is highly selective for semiconductor wafer 10.

Suitable dry etching techniques that can be employed in the present invention are reactive ion etching (RIE), chemical dry etching, ion beam etching, plasma etching and the like. The gases which may be employed in these dry etching techniques are those that have a high affinity for semiconductor wafer 10 and which inhibit the erosion of the dielectric or metal mask. Examples of some gases that can be employed in the present invention are $CF_4$, $SF_6$, $NF_3$, $CHF_3$, $C_4F_8$, $CHCl_3$, $O_2$, $Cl_2$, $Br_2$ and combinations thereof.

When a wet etch is used to etch holes 12, the chemical etchants employed include, but are not limited to: HF, NaOH, KOH, $H_2O_2$, ethylene diamine, ethanolamine and the like. Mixtures of these chemical etchants alone or with water are also contemplated herein. The chemical etchants may also be buffered to a desired pH using well known buffering agents. A highly preferred wet etch that is employed in the present invention is anodic etching which preferentially etches along the point of the highest applied electric field. As is known to those skilled in the art, anodic etching is an etching technique that is carried out by immersing a semiconductor wafer in a suitable chemical etchant in an anodization cell. A current (DC or AC) is passed from an electrode to the semiconductor wafer through the chemical etchant causing etching of exposed areas of the semiconductor wafer.

It is noted that the above etching techniques allow sidewall passivation for achieving anisotropy of the hole etching process during dry etching or orientation selective etching during wet etching. In cases wherein pre-fabricated wafers are employed, the alignment of holes is made from the back-side using through wafer alignment. This generally requires the use of an infra-red alignment system or an alignment system with many capturing images.

Figure 2B:
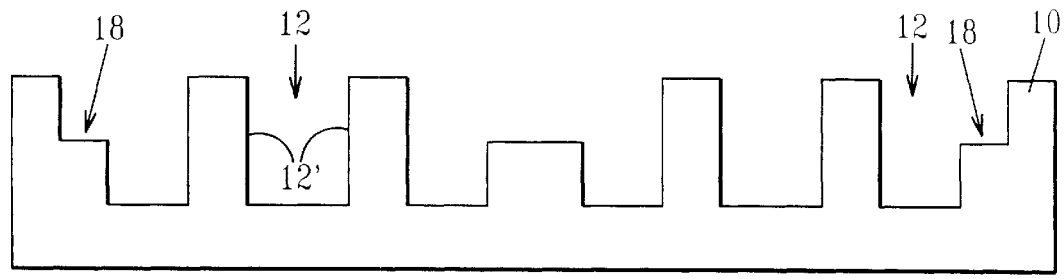

In one optional embodiment of the present invention, which is illustrated in FIGS. 1(B) and 2(B) respectively, lateral etching of semiconductor wafer is performed using one of the above identified etching techniques. This optional lateral etching step provides lateral spaces 18 in semiconductor wafer 10 that allows for thick lateral wiring. The remaining drawings of FIGS. 1 and 2 depict structures which contain lateral spaces 18.

Figure 2C:
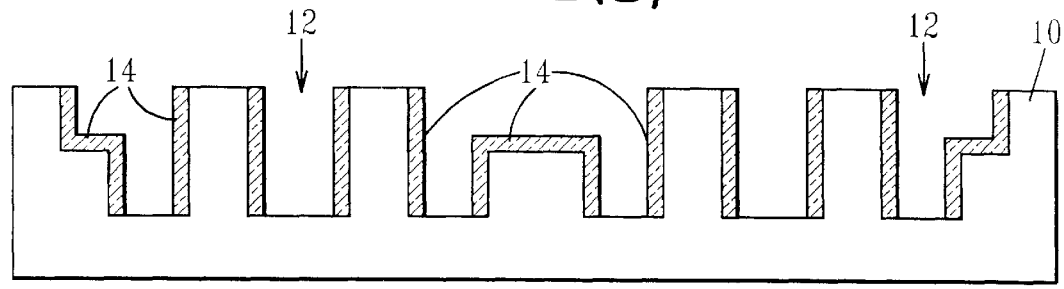

Following the etching of holes 12 and removal of the mask, a layer of electrically insulating material 14 is then formed so as to cover walls 12' and lateral spaces 18. This step of the present invention, including covering the laterally etched spaces, is illustrated in FIGS. 1(C) and 2(C), respectively. Suitable electrically insulating materials that are employed in the present invention in forming layer 14 are conventional insulators including, but not limited to: $SiO_2$, diamond-like carbon, $Si_3N_4$, $Al_2O_3$ and the like. A highly preferred electrically insulating material employed in the present invention is $SiO_2$. The electrically insulating material is formed in holes 12 and optional lateral spaces 18 by using through high temperature, i.e. thermal, oxidation or through deposition and etching. Both of the aforementioned techniques are well known to those skilled in the art and thus the conditions employed in forming layer 14 are also well known to those skilled in the art. For example, when thermal oxidation is employed in the present invention, it is typically carried out in a HCl containing $O_2$ ambient at temperatures of about 800° to about 1050° C. On the other hand, when deposition and etching are employed, the deposition is typically carried out using $SiH_4$ or tetraethyl orthosilicate (TEOS) chemistry.

Figure 2D:
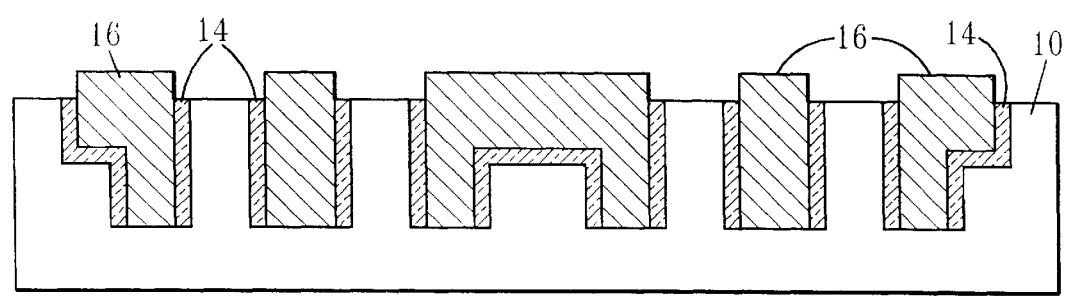

After covering walls 12' of holes 12 and optional lateral spaces 18 with the electrically insulating material 14, an electrically conductive material 16 is formed on said walls within the channel of hole 12 and optional lateral spaces 18. This step of the present invention is illustrated in FIGS. 1(D) and 2(D), respectively. Any conductor known to those skilled in the art can be used as the electrically conductive material. Suitable examples of conductors that may be employed in the present invention include, but are not limited to: W, Cu, Cr, Al, Ni, In, Au and the like. Mixtures or alloys of these conductors may also be employed in the present invention.

The electrically conductive layer, designated as 16 in the figures, is formed by utilizing either conventional electroplating or electroless plating processes. This includes plating that is carried out by seeded or unseeded growth of the conductor material. When seeding is employed, a full conductive metal layer is plated on the electrically insulating material and then a metal seed layer having a thickness of from about 0 to about 5000 Å is deposited on the full metal layer. The holes are then filled with the conductive metal layer. The full conductive metal layer and the metal seed layer may be composed of the same or different conductive metal. It is, however, preferred to use the same conductive metal as the full metal layer and the seed metal layer.

Figure 2E:
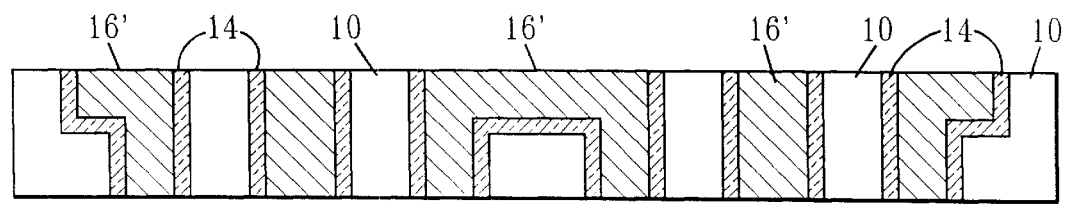

Next, the structures shown in FIGS. 1(D) and 2(D) are then planarized by using conventional techniques well known to those skilled in the art. This includes, for example, chemical-mechanical polishing. This step of the present invention is illustrated in FIGS. 1(E) and 2(E), respectively. In the case of the structure shown in FIG. 2(E), semiconductor wafer 10 was removed to expose the partly etched holes 12. The electrically conductive material 16 formed within the holes of the semiconductor wafer form micro-posts 16' which are used for interconnection with other semiconductor wafers.

Figure 3A:
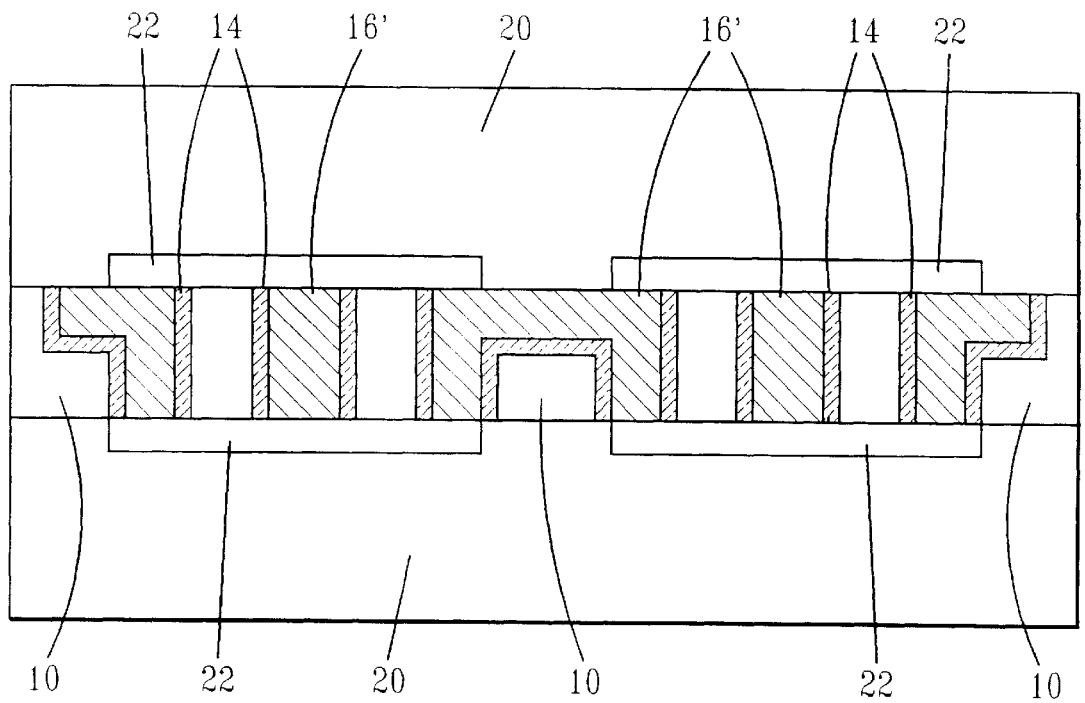
FIGS. 3(A)–3(B) are cross sectional views showing the interconnection of silicon wafers using the wafer shown in FIGS. 1(A)–(E).
Figure 3B:
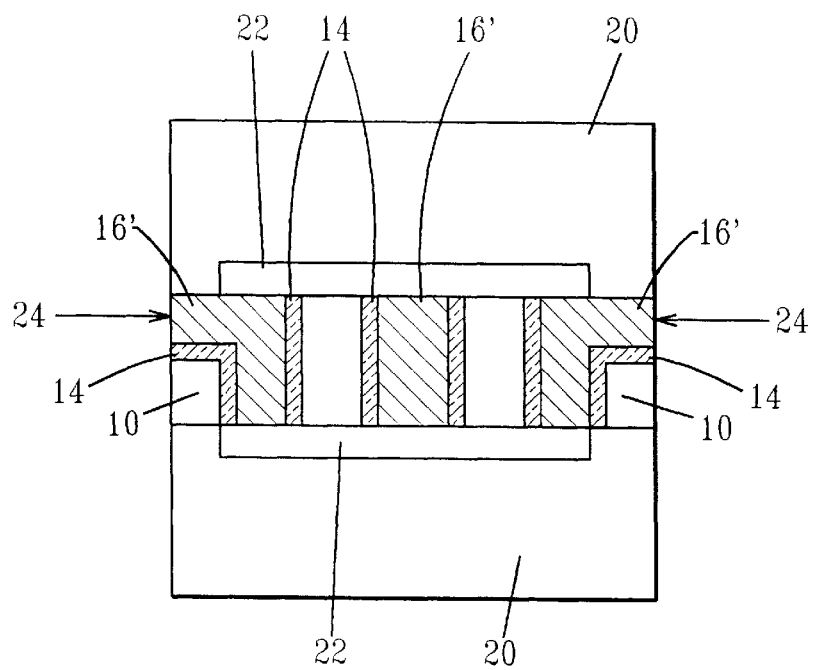

The interconnection between semiconductor wafers is shown in FIGS. 3(A)–(B). Specifically, in these figures, 20 denotes another semiconductor wafer containing circuit elements 22 on at least one of its surfaces. These wafers are interconnected to either of the structures shown in FIGS. 1(E) and 2(E), through micro-posts 16'. Bonding of circuit elements 22 to micro-posts 16' is carried out by utilizing a low temperature bonding material. Specifically, bonding occurs by applying a low temperature bonding material to micro-posts 16' and placing the circuitry elements 22 of semiconductor wafer 20 on at least some of the areas containing the bonding material. The bonding can also be made to occur through intermediate reaction or reflow. Indium, for example, would bond directly. The two wafers are bonded together by heating the same to a temperature of about 300° to about 500° C. for a time period of about 0 to about 60 minutes.

The term "low temperature bonding material" is used herein to denote a material which has a melting point below about 500° C. More specifically, the low temperature bonding material has a melting point of about 200° to about 400° C. Examples of materials that satisfy these conditions include, but are not limited to: indium or eutectic alloys. The wafers may also be bonded by using infra-red or frozen frame alignment and subsequent heat pulses at the above described temperatures ranges.

The bonded wafers are then diced as is shown in FIG. 3(B). The diced wafers now contain interconnects 24 that are available at the edge of the wafer.

Figure 4A:
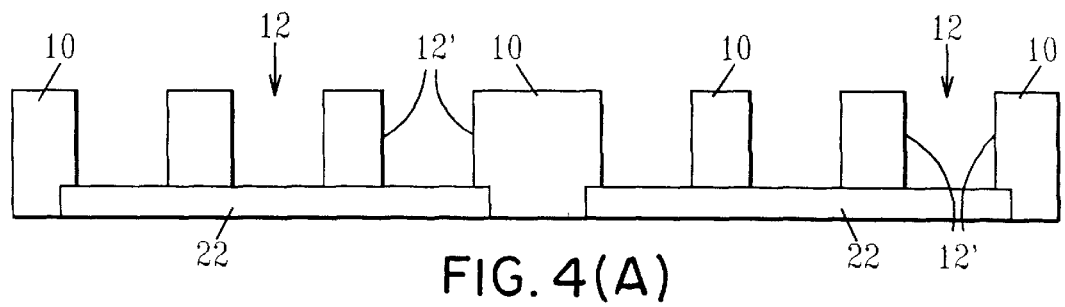
FIGS. 4(A)–4(F) are cross sectional views showing the interconnection of multiple wafers wherein the circuits were made on a processed wafer.
Figure 4B:
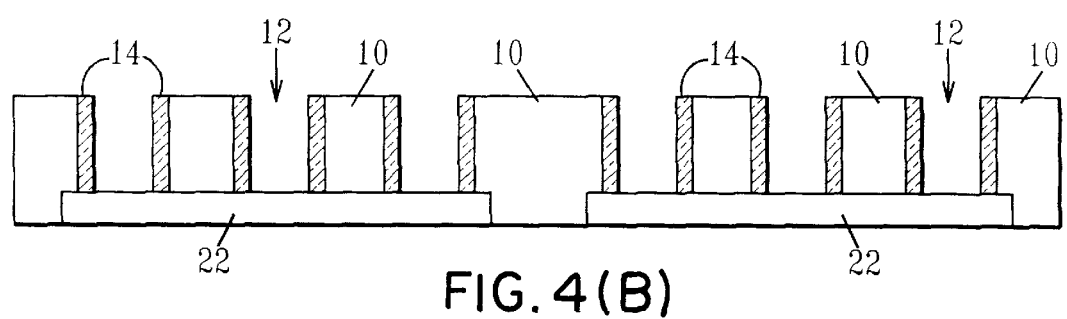
Figure 4C:
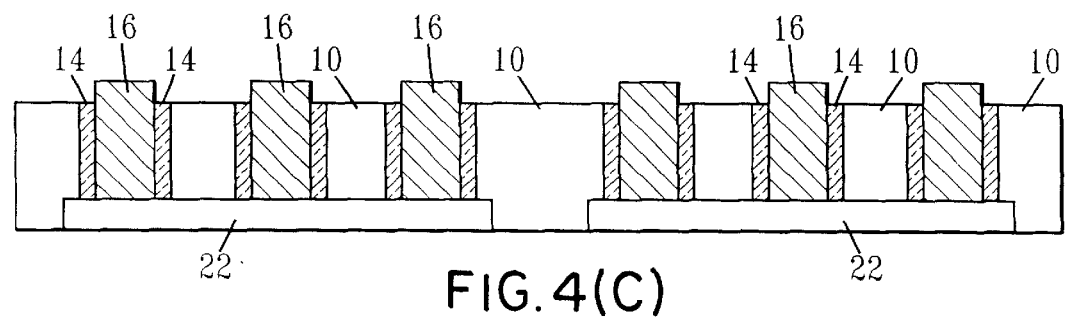
Figure 4D:
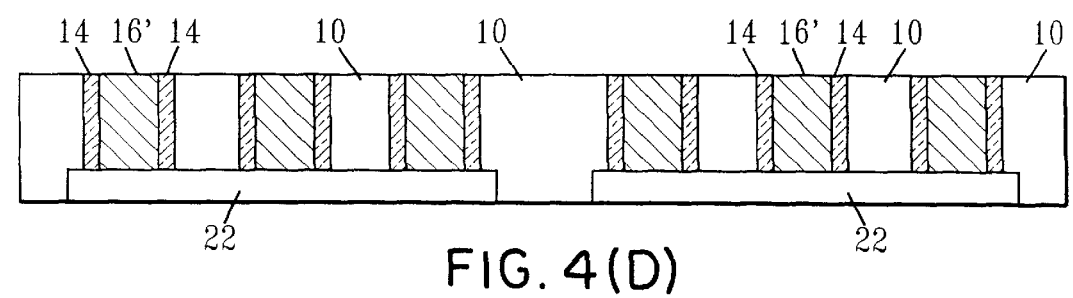

FIGS. 4(A)–(F) illustrate an alternate embodiment of the method of the present invention. In these figures, circuit elements 22 are present in semiconductor wafer 10. This preformed wafer, containing the circuit elements, is subjected to the above described processing steps. Specifically, as is shown in FIG. 4(A), holes 12 defined by walls 12' are etched partially through the preformed semiconductor wafer to expose areas of circuit elements 22. FIG. 4(B) shows the next step of the present invention wherein a layer of electrically insulating material 14 is formed on walls 12' and the exposed areas of circuit elements 22. Holes 12 are then filled with electrically conductive material 16 and then the structure shown in FIG. 4(C) is planarized to remove any electrically conductive metal 16 extending above the plane of the wafer. The final planarized structure; i.e. FIG. 4(D), contains the interconnection on top of the wafer which allows for vertical stacking of various wafers.

Figure 4E:
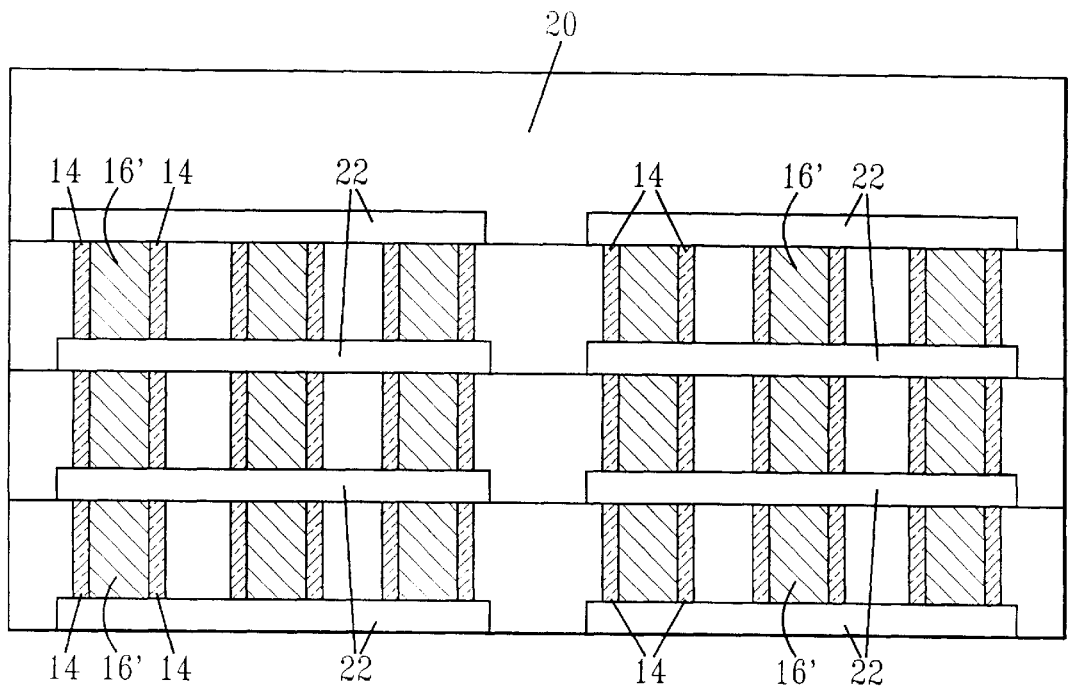
Figure 4F:
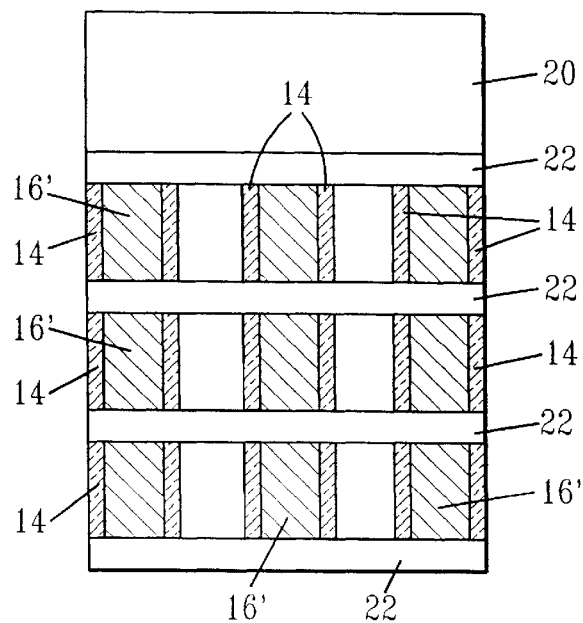

The vertical stacking of wafers is shown in FIGS. 4(E) and (F). Specifically, as is shown in FIG. 4(E), the multiple wafers shown in FIG. 4(C) can be vertically stacked by using the process, i.e. low temperature bonding material, as described herein above to bond micro-posts 161 to circuit elements 22. In this embodiment of the present invention, an infra-red or freeze-frame alignment apparatus is used to align the filled holes. The vertically stacked wafers shown in FIG. 4(E) can be diced as shown in FIG. 4(F) to provide a structure having interconnection between wafers together with connection at edges.

The above described method and structures can be used to form various microelectronic devices having an interconnection formed by the micro-posts of the present invention. As stated above, the interconnects produced in accordance with the present invention are highly dense, short (on the order of about 100 µm or less), capable of high speed, low resistance and low capacitance.

Figure 5:
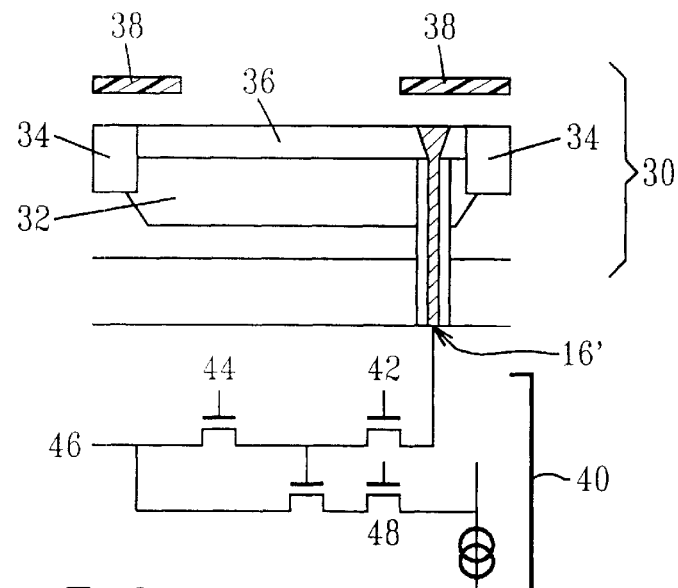
FIG. 5 is an illustration showing the interconnection of two wafers, one with imaging elements and the other with circuit elements.
Figure 6:
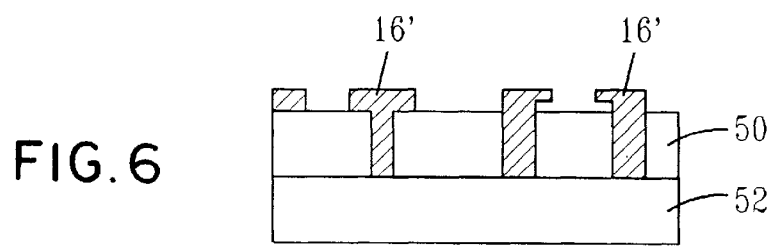
FIG. 6 is an illustration showing the interconnection of two wafers, one with wireless elements and the other with transistor circuit elements.
Figure 7:
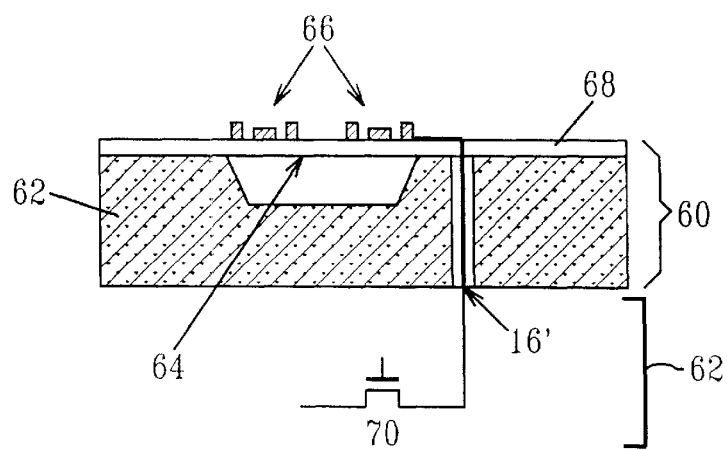
FIG. 7 is an illustration showing the interconnection of two wafers, one with micro-electro mechanical elements such as a sensor and the other with transistor circuits.

Some examples of various microelectronic devices that can be manufactured using the micro-post interconnects of the present invention are shown in FIGS. 5, 6 and 7. Specifically, in FIG. 5 there is shown an interconnection of two wafers, one having imaging elements and the other having circuits. In this figure, wafer 30 is a photodiode wafer containing micro-post 16' extending through said photodiode wafer, a p-well region 32, shallow trench isolation regions 34, $n^+$-doped channel 36, and light shield 38. Micropost 16' is used to interconnect photodiode wafer 30 to CMOS wafer 40. The CMOS wafer contains transfer region 42, reset region 44, $V_{dd}$, i.e. power supply, region 46, and rowselect 48.

In regard to FIG. 6 there is shown the interconnection of wafers wherein micro-post 16' is used to interconnect a wireless wafer 50 to a CMOS wafer 52. Each of the wafers are processed separately and are bonded using the bonding method described hereinabove.

FIG. 7 illustrates the interconnection of two wafers wherein micro-post 16' is used to connect a micro-electromechanical sensor (MEMS) wafer 60 to a CMOS wafer 62. MEMS wafer 60 includes a semiconductor material 62, e.g. Si, a diaphragm region 64 embedded in said semiconductor material 62 and sensor elements 66 on surface of insulating layer, e.g. $SiO_2$, 68. The CMOS wafer includes a control circuitry region 70.

While the invention has been particularly shown and described with respect to preferred embodiments thereof, it will be understood by those skilled in the art that the foregoing and other changes in form and details may be made without departing from the scope and spirit of the present invention. It is therefore intended that the invention not be limited to the exact forms described and illustrated, but should fall within the scope of the appended claims.

Having thus described our invention, what we claim as new, and desire to secure the Letters Patent is:

1. A method of manufacturing a microelectronic device comprising the steps of:
    (a) etching at least one hole defined by a wall and a channel at least partly through a wafer of a semiconductor material;
    (b) forming a layer of electrically insulating material to cover said wall; and
    (c) forming an electrically conductive material on said covered wall within said channel of said hole.

2. The method of claim 1 wherein said etching includes dry or wet etching.

3. The method of claim 2 wherein said etching is a dry etch selected from the group consisting of reactive ion etching, chemical dry etching and ion beam etching.

4. The method of claim 3 wherein said drying etching includes a gas selected from the group consisting of $CF_4$, $SF_6$, $NF_3$, $CHF_3$, $C_4F_8$, $CHCl_3$, $O_2$, $Cl_2$, $Br_2$ and mixtures thereof.

5. The method of claim 2 wherein said etching is a wet etch comprising a chemical etchant selected from the group consisting of HF, NaOH, KOH, $H_2O_2$, ethylene diamine and ethanolamine.

6. The method of claim 5 wherein said wet etch is carried out by anodic etching.

7. The method of claim 1 wherein said etching further provides optional lateral spaces adjacent to said holes.

8. The method of claim 1 wherein said electrically insulating material is selected from the group consisting of diamond-like carbon, $SiO_2$, $Si_3N_4$ and $Al_2O_3$.

9. The method of claim 8 wherein said electrically insulating material is $SiO_2$.

10. The method of claim 1 wherein said electrically insulating material is formed by oxidation.

11. The method of claim 10 wherein said oxidation comprises through high temperature oxidation or through deposition and etching.

12. The method of claim 1 wherein said electrically conductive material is selected from the group consisting of W, Cr, Cu, Al, Ni, In, Au and mixtures or alloys thereof.

13. The method of claim 1 wherein said electrically conductive material is formed by electroplating or electroless plating.

14. The method of claim 1 further comprising planarizing the structure formed after step (c).

15. The method of claim 14 wherein said planarizing includes chemical-mechanical polishing.

16. The method of claim 1 wherein said holes are etched partly through said wafer and comprising the further step of grinding a surface of said wafer to cause said hole to pass entirely through said wafer.

17. The method of claim 1 comprising a further step of stacking at least two wafers with at least one corresponding hole in alignment.

18. The method of claim 17 further comprising the step of heating said wafers in the presence of indium or a eutectic alloy under conditions effective to form an electrical connection between the conducting material of corresponding holes or to form contacts in a circuit.

19. The method of claim 17 further comprising the step of dicing said wafers into individual chip elements.

20. The method of claim 1 wherein said semiconductor wafer has circuitry on at least one of its surfaces.

* * * * *